United States Patent
Deguchi et al.

[11] Patent Number: 5,252,174
[45] Date of Patent: Oct. 12, 1993

[54] METHOD FOR MANUFACTURING SUBSTRATES FOR DEPOSITING DIAMOND THIN FILMS

[75] Inventors: Masahiro Deguchi, Mukoh; Takashi Hirao, Moriguchi, both of Japan

[73] Assignee: Matsushita Electric Industrial Co., Ltd., Osaka, Japan

[21] Appl. No.: 888,430

[22] Filed: May 28, 1992

Related U.S. Application Data

[63] Continuation of Ser. No. 540,621, Jun. 19, 1990, abandoned.

[30] Foreign Application Priority Data

Jun. 19, 1989 [JP] Japan .............................. 1-156540

[51] Int. Cl.5 .............................................. C30B 25/08
[52] U.S. Cl. .................................. 156/612; 156/613; 156/DIG. 68; 423/446; 427/580; 427/527
[58] Field of Search ............... 156/612, 613, DIG. 68; 423/446; 427/39

[56] References Cited

U.S. PATENT DOCUMENTS 4,997,636  3/1991  Prins .................... 423/446

FOREIGN PATENT DOCUMENTS

| | | | |
|---|---|---|---|
| 0122794 | 7/1985 | Japan | 423/446 |
| 0186499 | 9/1985 | Japan | 423/446 |
| 1151096 | 7/1986 | Japan | 423/446 |
| 1251506 | 11/1986 | Japan | 423/446 |
| 1145313 | 6/1989 | Japan . | |
| 8810321 | 12/1988 | PCT Int'l Appl. . | |

OTHER PUBLICATIONS

Kimura et al., "Thin Solid Films", 81 319-327 (1981).
Patent Abstracts of Japan, vol. 19, No. 247 (C-307) [1970], Oct. 3, 1985.

*Primary Examiner*—Robert Kunemund
*Assistant Examiner*—Felisa Garrett
*Attorney, Agent, or Firm*—Wenderoth, Lind & Ponack

[57] ABSTRACT

A method for manufacturing substrates for depositing diamond thin films is disclosed.

In the method, a hydrocarbon gas is discharge-decomposed, products generated by the discharge decomposition are accelerated to implant them in a surface layer of a substrate made of a material other than diamond and, thereby, the surface layer having bondings of carbon atoms and atoms compositing the substrate. Desirably, the substrate thus manufactured is subjected to a heat treatment at a temperature ranging from 800° to 1,200° C.

5 Claims, 6 Drawing Sheets

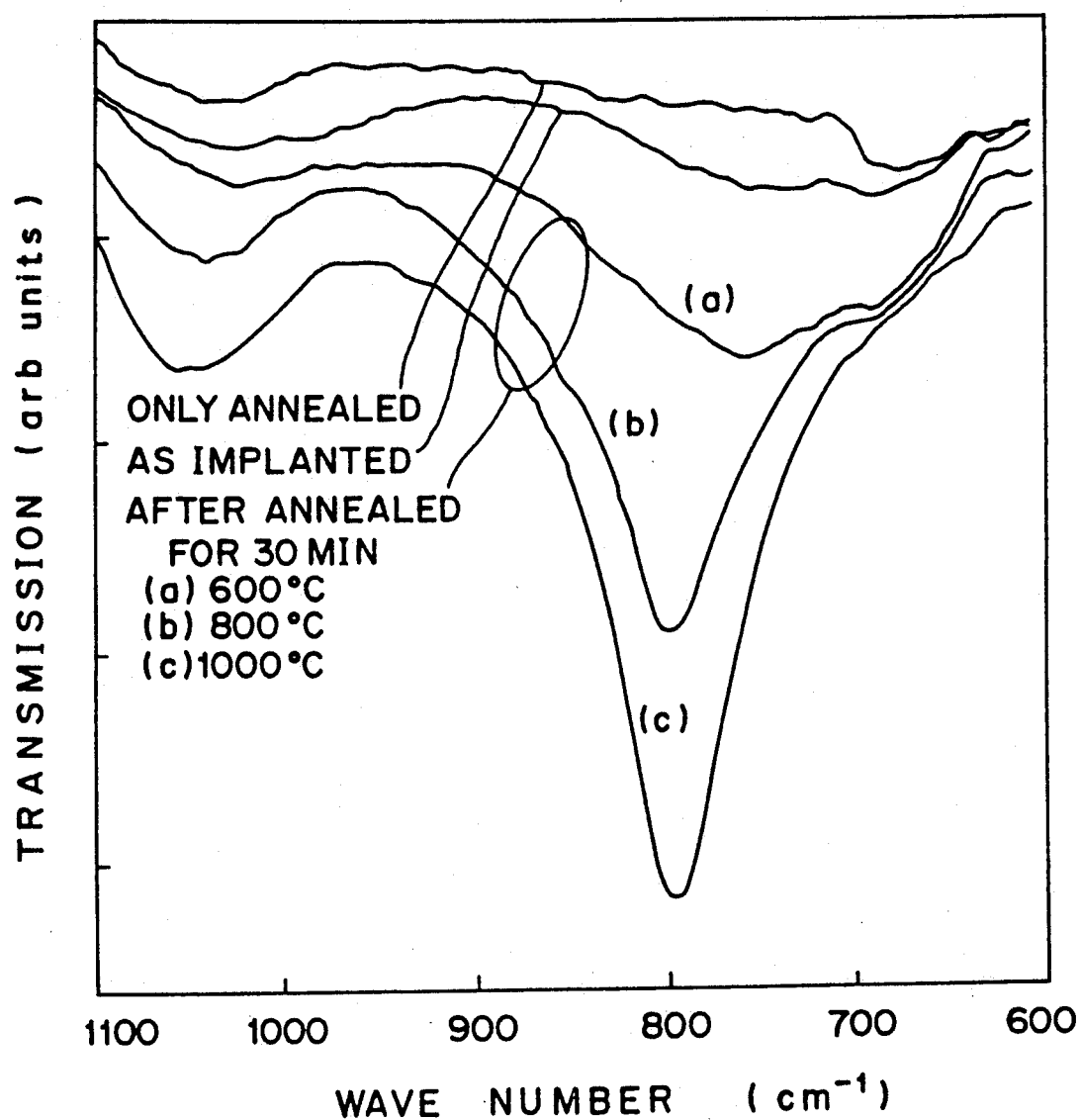

METHOD FOR MANUFACTURING SUBSTRATES FOR DEPOSITING DIAMOND THIN FILMS

This application is a continuation of application Ser. No. 07/540,621 filed on Jun. 19, 1990, now abandoned.

BACKGROUND OF THE INVENTION

1. Field of the Invention

The present invention relates to a method for manufacturing substrates for depositing diamond thin films.

2. Related Art

Diamond thin films are utilized for protection films of semiconductor chips and coating films for various cutting tools.

To deposit diamond thin films as carbonaceous thin films so as to have a reasonable crystal structure, it is necessary to consider not only growing methods therefor but also materials of substrates on which diamond thin films are deposited.

Conventionally, there have been used single crystal diamond substrates since they are composited by the same material as that of the growth films to be deposited. When they are used, it is possible to obtain thin films with an excellent crystal structure. Such a method as mentioned above is called homo-epitaxial growth method.

On the other hand, there has been known the hetero-epitaxial growth method in which films are grown on substrates made of a material different from that of the films. This method enables application of diamond thin films for a variety of technical fields since various substrates are available.

At present, a variety of materials such as silicon, silicon carbide and the like are used for this method.

It has been also tried to process the surface of the substrate artificially together with selection of materials therefor. For instance, roughing of the surface of the silicon substrate using an inert ion beam or diamond grinding stone has been proposed.

In order to form diamond thin films according to the homo-epitaxial method, it becomes necessary to use single crystal diamond substrates. However, the diamond substrate is very expensive and it is difficult to make diamond substrates of large scale.

On the other hand, the selection of the substrate is important in order to form carbonaceous thin films according to the hetero-epitaxial method.

The generation and growth of diamond kernels in the initial phase of the deposition of films are important for the growth of diamond films and it depends on the material and the state of surface of the substrate to be used.

Conventionally, the artificial roughing of the surface of the substrate has been proposed to increase the generation density of diamond kernels. However, in this method, it is impossible to control the crystal orientation of the film to be deposited although the generation density of diamond kernels is increased.

In general, the hetero-epitaxial method is inferior to the homo-epitaxial method on the crystalline structure of the film.

As mentioned above, conventional substrates used for depositing diamond thin films are not so satisfactory to obtain diamond thin films with an excellent crystal structure. Especially in the hetero-epitaxial method, there have been known no effective improvements in controlling the crystal structure and orientation of the diamond thin film.

SUMMARY OF THE INVENTION

One object of the present invention is to provide a method for manufacturing substrates made of a material other than diamond which enable deposition of diamond thin films with a good crystal structure.

Another object of the present invention is to provide a method for manufacturing substrates made of a material other than diamond which have surface layers suitable for deposition of the diamond thin film.

One more object of the present invention is to provide a method for manufacturing substrates made of a material other than diamond which is capable of controlling the generation density of diamond kernels and the deposition area of the diamond thin film artificially.

In order to accomplish these objectives, according to the present invention, there is provided a method for manufacturing substrates for depositing diamond thin films being comprised by decomposing hydrocarbon gas by electric discharge, accelerating the products obtained by a direct current electric field smaller than 10 k volts, irradiating the accelerated products onto a surface of a substrate material being kept at a temperature ranging from 10° to 800° C. and, thereby, forming a domain having a crystal structure being comprised of carbon atoms and atoms of said substrate material substantially at the surface thereof.

The surface layer formed according to the present invention has the substantially same bonding structure as that of diamond and, thereby, a diamond thin film is deposited thereon with excellent crystal structure and crystalline orientation.

According to one aspect of the present invention, the surface of the substrate material is covered with a mask having a predetermined masking pattern. In this case, the surface layer suitable for depositing a diamond thin film is formed according to the masking pattern and, therefor, it becomes possible to control the generation density of diamond kernels and the deposition area.

According to another aspect of the present invention, the substrate having been manufactured is subjected to a heat treatment at a temperature ranging from 800° to 1,200° C. This refines the crystal structure of the surface layer especially.

BRIEF DESCRIPTION OF THE DRAWINGS

These and other objects and features of the present invention will become clear from the following description taken in conjunction with the preferred embodiment thereof with reference to the accompanying drawings, in which:

FIG. 4 is a spectrum obtained by an infrared spectroscopic analysis of the substrate manufactured according to the present invention.

DETAILED DESCRIPTION OF THE PREFERRED EMBODIMENT

Figure 1:
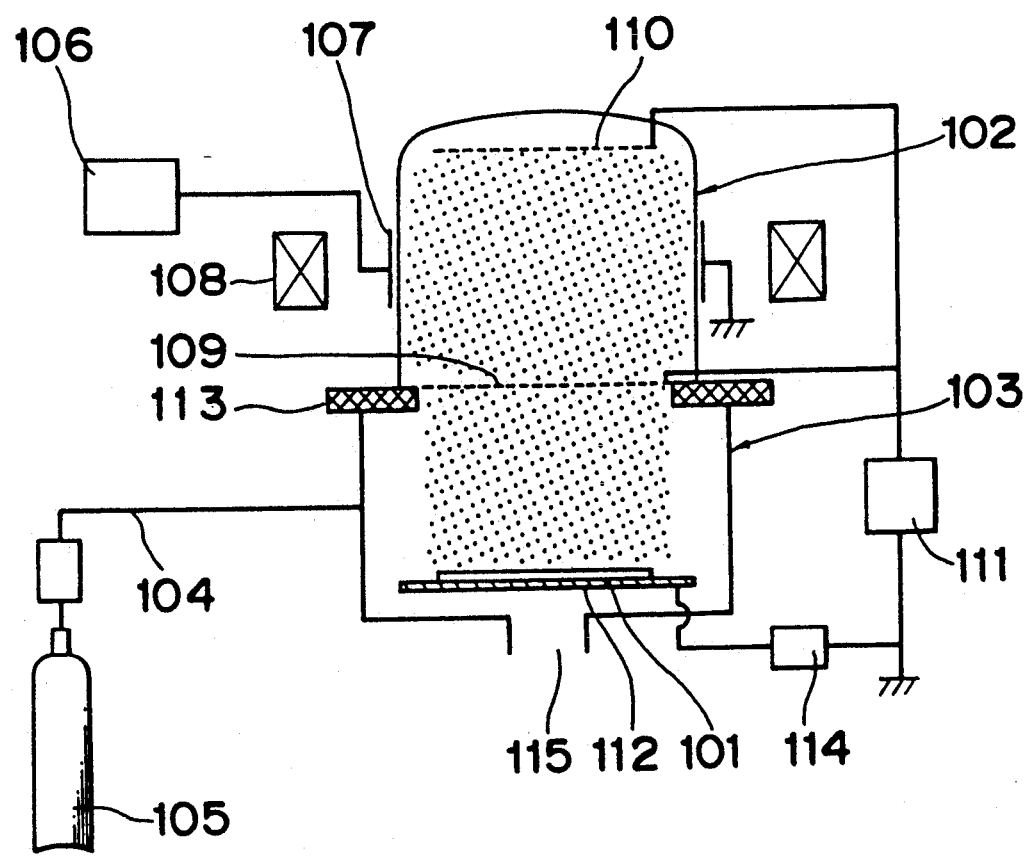
FIG. 1 is an explanatory view for showing an apparatus for manufacturing substrates according to the present invention.

FIG. 1 is an explanatory view of an apparatus for generating products by discharge decomposition of hydrogen carbon gas and irradiating them onto a substrate made of a material other than diamond.

The apparatus is comprised of a discharge chamber 102 for discharge decomposing the hydrogen carbide gas and an irradiation chamber 103 for accelerating ions generated to an ion beam of a large diameter and irradiating the ion beam to the surface of a substrate 101 made of a material other than diamond.

A gas is supplied into the discharge chamber 102 from a gas bomb 105 through a gas conduit 104. In the gas bomb 105, a hydrogen carbide gas such as methane ($CH_4$) gas is contained in order to generate carbon ions. The discharge chamber 102 is formed by a cylinder of bell shape which is made of quartz and, on the outer surface of the cylinder, a pair of electrodes 107 of a high frequency power source 106 is arranged. The frequency thereof is 13.56 MHz. On the outside of the pair of electrodes 107, an electromagnet 108 is arranged for generating a static magnetic field in the axial direction of the discharge chamber 102. This magnetic field enhances the efficiency of generation of ions among the products in the discharge chamber. In the discharge chamber 102, first and second electrodes 109 and 110 are arranged oppositely in the axial direction of the chamber to accelerate ions generated. The first and second electrodes 109 and 110 are connected to a direct current voltage source 111 to apply a direct current voltage smaller than 10 kV. The discharge chamber 102 and the irradiation chamber 103 are mutually insulated by an annular insulation flange 113 arranged therebetween.

Ions and neutral products accelerated by a direct current electric field generated between the first and second electrodes 109 and 110 are irradiated onto the surface of the substrate 101 put on a substrate platen 112 and are implanted into the substrate 101. When the acceleration voltage between the first and second electrodes 109 and 110 exceeds 10 kV, the surface of the substrate 101 is undesirably damaged and bonding of ions with atoms compositing the substrate 101 is formed too deep to utilize the substrate as that for depositing a diamond thin film thereon. The substrate platen 112 has a role to heat the substrate 101 put thereon. It becomes possible to repair damage to the substrate 101 caused upon irradiation at a lower temperature by heating the same 101. The heating temperature is controlled not to exceed 600° C. as an upper limit taking the annealing temperature and requirement of low temperature deposition of the diamond thin film into consideration. Electric power for heating the substrate platen 112 is supplied from the DC voltage source 111 through an ammeter 114.

The decomposed gas is discharged from a discharging duct 115 connected to the bottom of the irradiation chamber 103.

Figure 2:
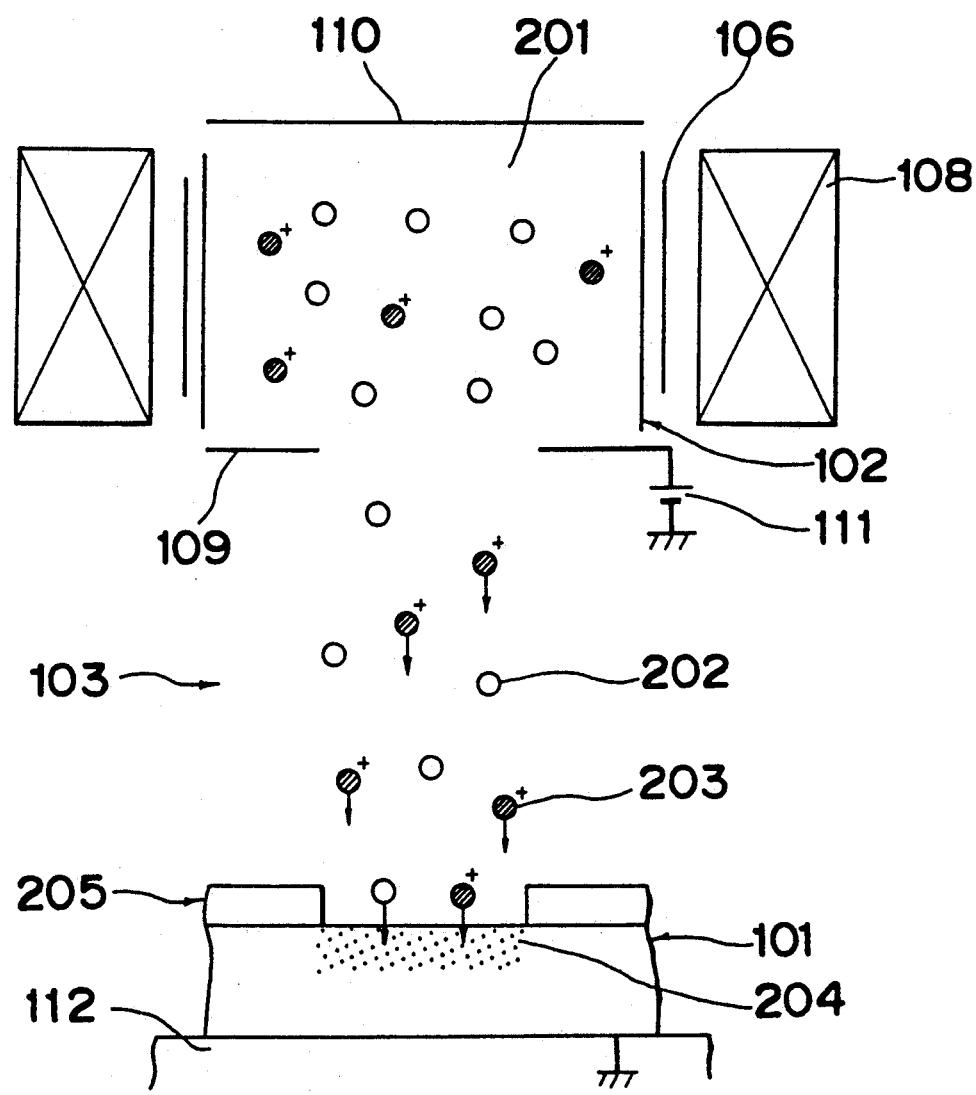
FIG. 2 is a schematic model for showing a manner of irradiation of products onto a substrate material.

FIG. 2 is a schematic view for showing a manner of irradiation of products onto a substrate covered with a mask 205.

In this preferred embodiment, single crystal silicon substrates were used. Methane gas was used as the hydrocarbon gas. Other conditions were as follows; the acceleration voltage=3 kV, the discharge electric power=20 W, the pressure in the chamber=$6.3 \times 10^{-4}$ Torr and the magnetic field applied=30 gauss.

Figure 3:
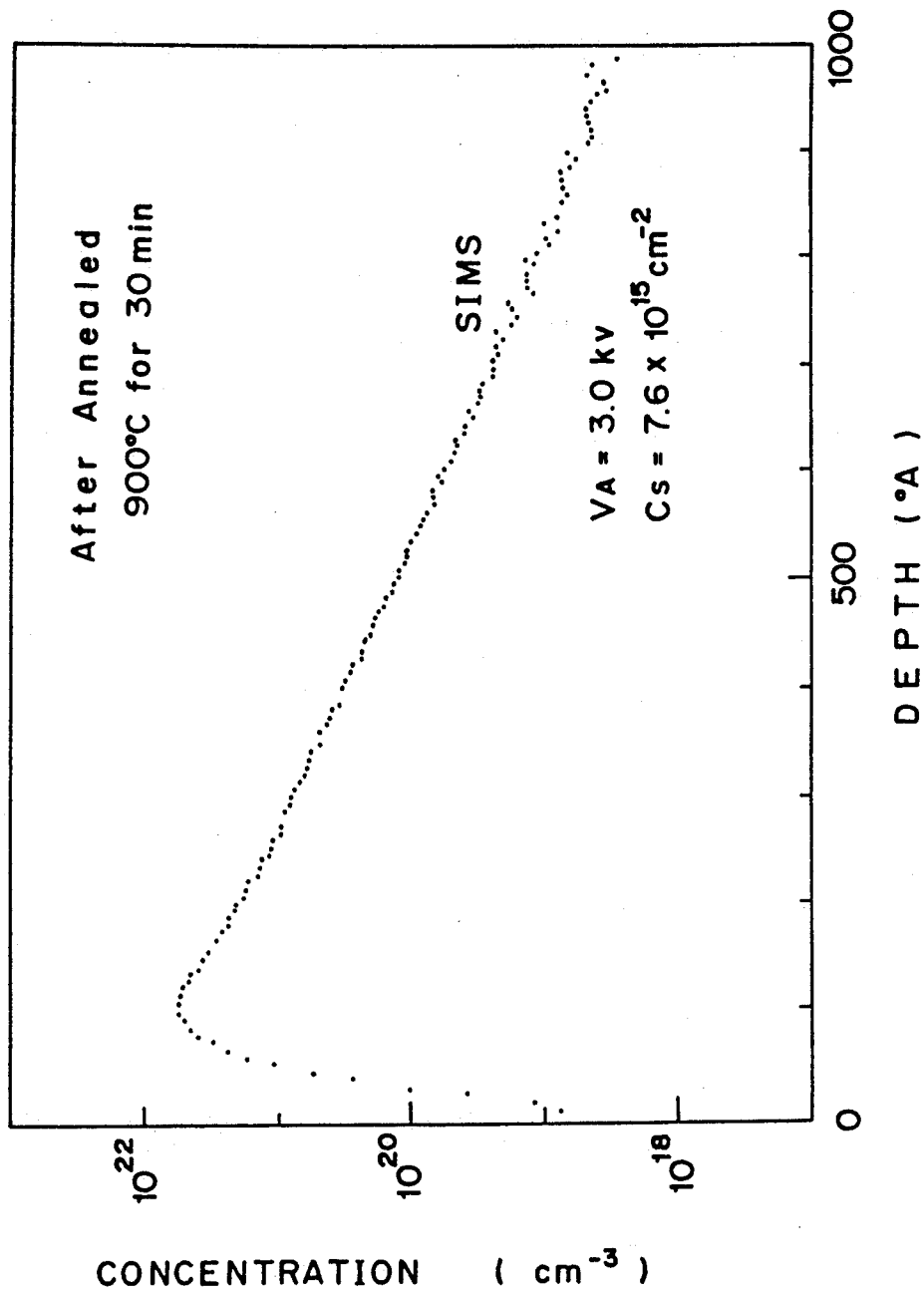
FIG. 3 is a graph showing a concentration of secondary ion obtained when used a silicon substrate and methane gas as the hydrogen carbide gas according to the present invention.

FIG. 3 shows the result obtained by the mass spectrum analysis of the secondary ion regarding the silicon substrate manufactured under conditions mentioned above. As is apparent from FIG. 3, it is understood that accelerated neutral products 202 and ions 203 were implanted only in a very thin surface layer of the substrate. The inventors of the present invention confirmed from a photo-electron spectroscopic analysis of the surface and the surface layer of the silicon substrate that Si-C bondings were formed in the surface thin layer.

FIG. 4 shows an absorption spectrum of the silicon substrate obtained by the infrared absorption spectroscopic method. The absorption observed at a wave number near 800 $cm^{-1}$ corresponds to the absorption by the SiC bonding formed under conditions mentioned above according to the present invention and it is understood that the amount of Si-C bonding is increased by the annealing treatment.

The inventors of the present invention confirmed based on measurements by photoelectron spectroscopy or reflected electron beam diffraction, that much more suitable substrates for depositing diamond thin films could be obtained by subjecting the substrates having been manufactured to a heat treatment at a predetermined temperature ranging from 800° to 1,200° C. since the SiC cubic crystal formed thereby exhibited an excellent crystalline structure.

Figure 5A:
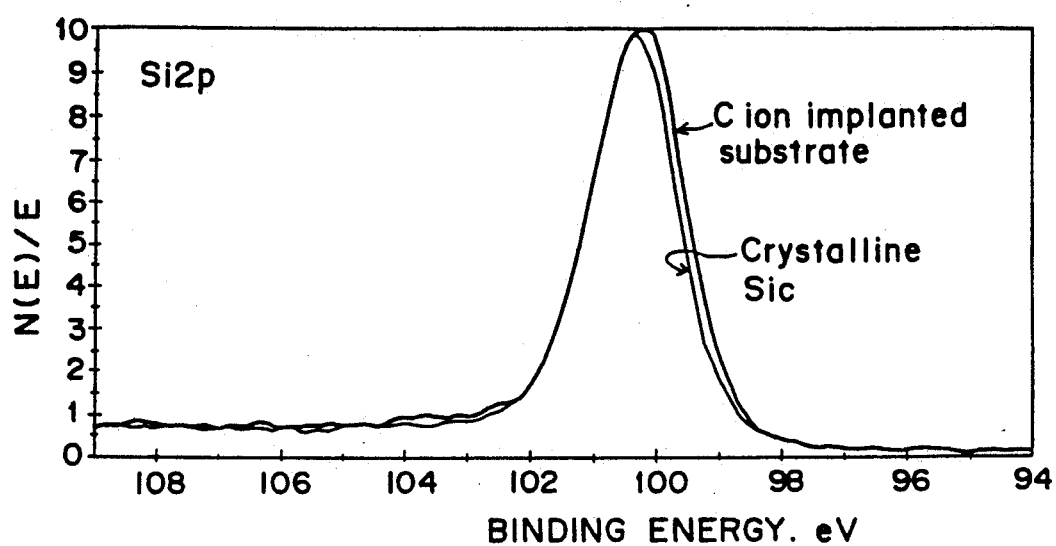
FIGS. 5(a) and 5(b) are views showing results obtained by the photo-electron spectroscopy of the surface and the surface layer of the substrate made according to the present inventions, respectively.
Figure 5B:
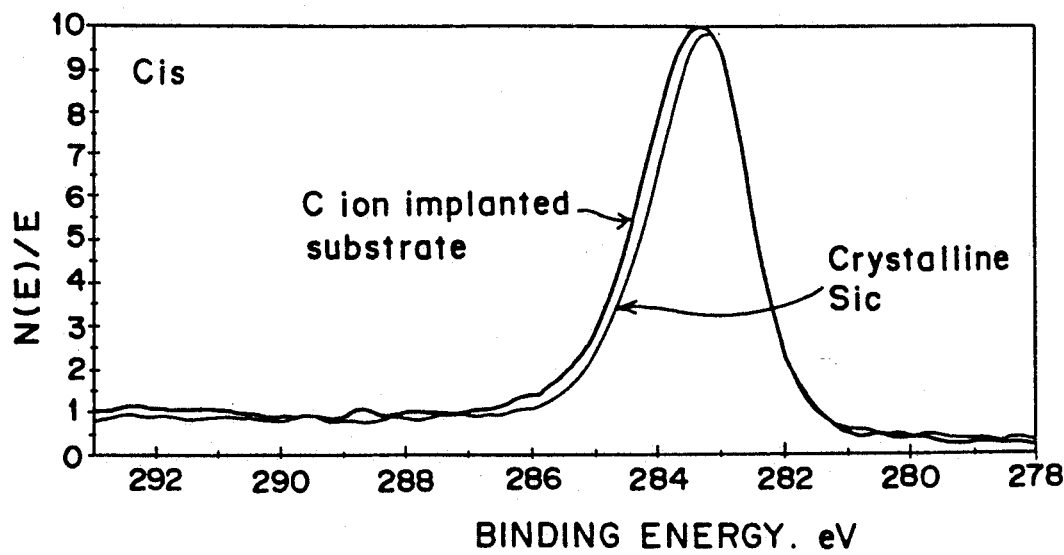

FIGS. 5(a) and 5(b) show results observed with respect to crystalline or bonding states of the surface and the surface layer 204 of the Si substrate having been subjected to an annealing treatment at 1150° C. for 5 minutes in argon atmosphere using the photoelectron spectroscopy. Due to these results, the surface and the surface layer 204 of the annealed Si substrate have a substantially same bonding state as that of SiC crystal. Further, it was confirmed that the crystal structure was cubic from a result of the reflected electron beam diffraction made by the inventors.

This indicates that the substrate above mentioned is extremely suitable for substrates for depositing diamond thin films. It has been observed that an intermediate layer of SiC is formed on the surface of the Si substrate upon hetero-epitaxying a diamond thin film thereon and the crystalline structure thereof is cubic. Namely, the SiC cubic crystal layer formed according to the present invention contributes to the formation of the intermediate layer of SiC.

Figure 6:
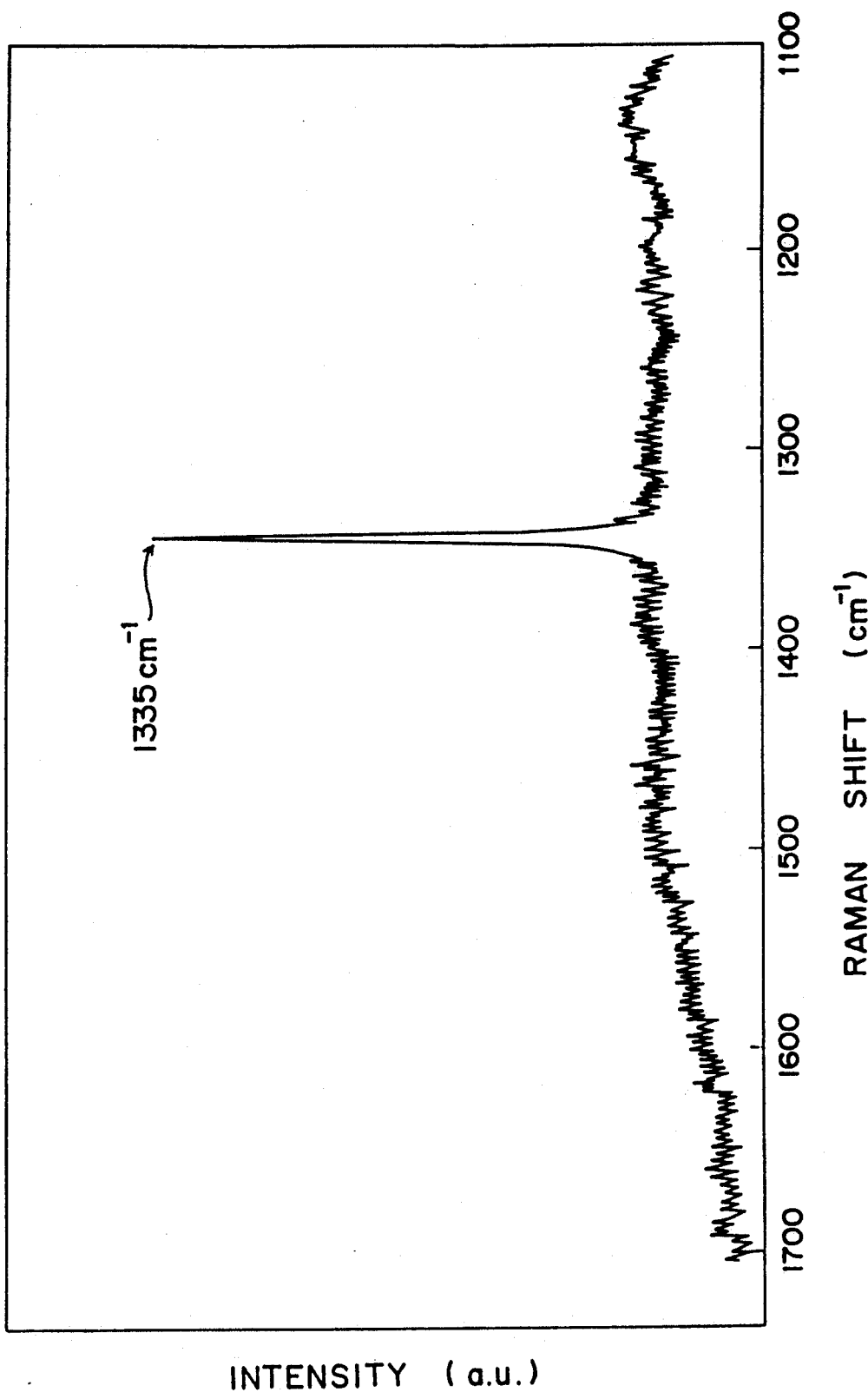
FIG. 6 is a view showing a result of the Raman spectroscopy of the diamond thin film deposited on the substrate according to the present invention.

FIG. 6 shows a result of Raman spectroscopy of the diamond thin film deposited on the substrate made according to the present invention.

This data indicates that almost nothing of components other than diamond are contained in the diamond thin film and therefor, it is understood that the diamond thin film obtained is of excellent quality.

This was confirmed by measurements using X-ray diffraction and reflected electron beam diffraction. Further, the diamond thin film according to the present invention has a very smooth flat surface when compared with the conventional diamond thin film. This was confirmed by the observation using an electron beam microscope. This indicates that the present invention contributes to the formation of diamond kernels efficiently.

The inventors also confirmed that the efficiency of formation of SiC was greatly enhanced by 20 to 25% in the case that the surface of the silicon substrate was formed with (111) face of the single crystal silicon when compared with other cases in that the surface has a face orientation other than (111) face.

According to the present invention, it becomes possible to manufacture substrates at a relatively low temperature and with a large scale while controlling the generation density of diamond nuclei and the orientation of the crystal artificially.

Also, it can be expected that the cubic crystal of SiC can be formed using substrates made of a material other than silicon according to the present invention.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A method for manufacturing substrates for depositing diamond thin films which comprises:
   a. decomposing hydrocarbon gas,
   b. accelerating products obtained in a. by a direct current electric field smaller than 10 kv,
   c. implanting the accelerated products of b. into a single crystalline silicon substrate kept at a temperature ranging from 10° to 800° C. and, thereby,
   d. forming a carbonized surface layer substantially inside the substrate thereof, said carbonized surface layer containing Si-C bonds.

2. The method as claimed in claim 1, in which said substrate material is partially covered with a mask.

3. The method as claimed in claim 1, in which said products are ions.

4. The method as claimed in claim 1, in which the surface of said single crystal silicon for forming said layer is (111) plane.

5. The method as claimed in claim 1, further provides a step for subjecting said substrate to a heat treatment at a temperature ranging from 800° to 1,200° C.

* * * * *